(12) United States Patent
Lin et al.

(10) Patent No.: US 8,388,793 B1
(45) Date of Patent: Mar. 5, 2013

(54) METHOD FOR FABRICATING CAMERA MODULE

(75) Inventors: Tzy-Ying Lin, Hsinchu (TW); Chieh-Yuan Cheng, Hsinchu (TW); Hung-Yeh Lin, Yilan County (TW)

(73) Assignees: VisEra Technologies Company Limited, Hsinchu (TW); OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 13/219,948

(22) Filed: Aug. 29, 2011

(51) Int. Cl.
*B32B 37/00* (2006.01)
*B32B 38/04* (2006.01)
*B32B 38/10* (2006.01)
*B32B 43/00* (2006.01)

(52) U.S. Cl. .................. 156/247; 156/272.2; 156/272.8; 156/701

(58) Field of Classification Search .................. 156/247, 156/272.2, 272.8, 701
See application file for complete search history.

(56) References Cited

U.S. PATENT DOCUMENTS

| | | | |
|---|---|---|---|
| 6,306,694 B1 * | 10/2001 | Yamazaki et al. | 438/151 |
| 6,521,912 B1 * | 2/2003 | Sakama et al. | 257/57 |
| 6,625,864 B2 * | 9/2003 | Nemoto et al. | 29/527.2 |
| 6,654,176 B2 * | 11/2003 | Yoshikawa et al. | 359/627 |
| 6,893,941 B2 * | 5/2005 | Suda | 438/455 |
| 6,898,015 B2 * | 5/2005 | Yoshikawa et al. | 359/619 |
| 7,009,772 B2 * | 3/2006 | Hsiao et al. | 359/619 |
| 7,009,774 B2 * | 3/2006 | Yoshikawa et al. | 359/626 |
| 7,037,779 B2 * | 5/2006 | Nakajima | 438/257 |
| 7,329,861 B2 * | 2/2008 | Ma et al. | 250/239 |
| 7,703,997 B2 * | 4/2010 | Lee et al. | 396/529 |
| 7,732,244 B2 * | 6/2010 | Cheng et al. | 438/69 |
| 7,768,574 B2 * | 8/2010 | Humpston | 348/374 |
| 7,968,461 B2 * | 6/2011 | Maekawa et al. | 438/674 |
| 8,049,806 B2 * | 11/2011 | Feldman et al. | 348/340 |
| 8,059,341 B2 * | 11/2011 | Lin et al. | 359/620 |
| 8,114,701 B2 * | 2/2012 | Kwon et al. | 438/68 |
| 8,124,439 B2 * | 2/2012 | Bolis | 438/65 |
| 2003/0039035 A1 * | 2/2003 | Yoshikawa et al. | 359/619 |
| 2003/0057359 A1 * | 3/2003 | Webster | 250/216 |
| 2004/0061946 A1 * | 4/2004 | Yoshikawa et al. | 359/626 |
| 2006/0044450 A1 * | 3/2006 | Wolterink et al. | 348/340 |
| 2007/0019032 A1 * | 1/2007 | Maekawa et al. | 347/45 |
| 2007/0166029 A1 * | 7/2007 | Lee et al. | 396/529 |
| 2009/0162967 A1 * | 6/2009 | Cheng et al. | 438/69 |
| 2009/0225431 A1 * | 9/2009 | Lee | 359/621 |
| 2011/0180893 A1 * | 7/2011 | Minegishi et al. | 257/432 |
| 2011/0292271 A1 * | 12/2011 | Lin et al. | 348/340 |

* cited by examiner

*Primary Examiner* — Sing P Chan
(74) *Attorney, Agent, or Firm* — Muncy, Geissler, Olds & Lowe, PLLC

(57) ABSTRACT

The invention provides a method for fabricating a camera module. An exemplary embodiment of the method for fabricating a camera module comprises providing plurality of lens sets. A dry film layer is formed on the plurality of lens sets. The dry film layer is patterned to form a plurality of dry film patterns respectively attaching to a plurality of lens sets. The plurality of lens sets are separated. A lens set separated from the plurality of lens sets is bonded to an image sensor device chip. The dry film pattern on the lens set is removed.

16 Claims, 6 Drawing Sheets

METHOD FOR FABRICATING CAMERA MODULE

BACKGROUND OF THE INVENTION

1. Field of the Invention

The present invention relates to applying the dry film material by a wafer level lithography process to fabricate a camera module.

2. Description of the Related Art

The conventional camera module is fabricated by laminating lenses on a substrate having optical devices thereon, and then the substrate laminated with the lenses is diced and divided into several individual camera module units. During the formation of the conventional camera module, a product yield thereof is lowered because the removal step of a protection film for the plurality of optical lenses of the plurality of lens cubes may destroy an aperture of the optical lens.

A novel method for fabricating a camera module without destroying the apertures of the plurality of optical lenses is desired.

BRIEF SUMMARY OF INVENTION

Methods for fabricating a camera module are provided. An exemplary embodiment of the method for fabricating a camera module comprises providing plurality of lens sets. A dry film layer is formed on the plurality of lens sets. The dry film layer is patterned to form a plurality of dry film patterns respectively attaching to a plurality of lens sets. The plurality of lens sets are separated. A lens set separated from the plurality of lens sets is bonded to an image sensor device chip. The dry film pattern on the lens set is removed.

Another exemplary embodiment of the method for fabricating a camera module comprises a first wafer having a plurality of first lens elements thereon. A first spacer element on the first wafer for isolating the first lens elements each other is formed. A dry film layer is formed on the first spacer element. The dry film layer is patterned to form a plurality of dry film patterns respectively attaching to a plurality of lens sets. The plurality of lens sets are separated. A lens set separated from the plurality of lens sets is bonded to an image sensor device chip. The dry film pattern on the lens set is removed.

Yet another exemplary embodiment of the method for fabricating a camera module comprises a first wafer having a plurality of first lens elements thereon. A first spacer element on the first wafer for isolating the first lens elements each other is formed. A second wafer having a plurality of second lens elements thereon is bonded to the first spacer element, wherein the plurality of second lens elements aligns to the plurality of first lens elements. A second spacer element is formed on the second wafer for isolating the second lens elements each other. A dry film layer is formed on the second spacer element. The dry film layer is patterned to form a plurality of dry film patterns respectively attaching to a plurality of lens sets. The plurality of lens sets are separated. A lens set separated from the plurality of lens sets is bonded to an image sensor device chip. The dry film pattern on the lens set is removed A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1A:
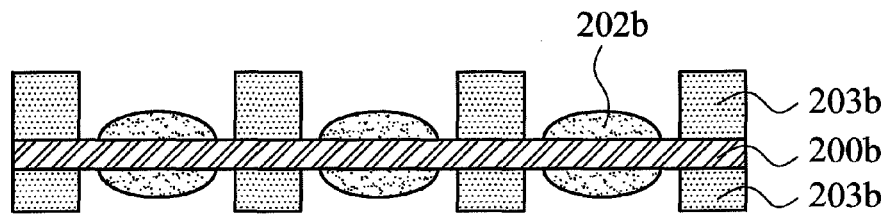
FIGS. 1a-1c, 2a-2b, 3a-3b and 4-9 are cross section views or top views showing exemplary embodiments of a method for fabricating a camera module of the invention.

The following description is of a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

FIGS. 1a-1c, 2a-2b, 3a-3b and 4-9 are cross section views or top views showing exemplary embodiments of a method for fabricating a camera module of the invention. The method for fabricating the camera module utilizes a dry film to prevent an optical lens set from being covered by coating materials, such as an electromagnetic interference (EMI) shielding material or a light shielding material applied during subsequent processes.

FIG. 1a is a cross section view showing the exemplary embodiment of lens sets constituted by lens elements on a single wafer.

Referring to FIG. 1a, a plurality of lens sets in wafer level are provided. A first wafer 200b having first lens elements 202b thereon is provided. A first spacer element 203b is then formed on the first wafer 200b for isolating the first lens elements 200b each other. The lens sets are constituted by first lens elements 202b on two sides of a first wafer 200b and first spacer elements 203b. The first wafer 200b may comprise a transparent material. The first spacer elements 203b may be arranged as an array on two sides of the first wafer 200b. Alternatively, the first lens elements 202b and the first spacer elements 203b may be respectively arranged on one side of the first wafer 200b.

Figure 1B:
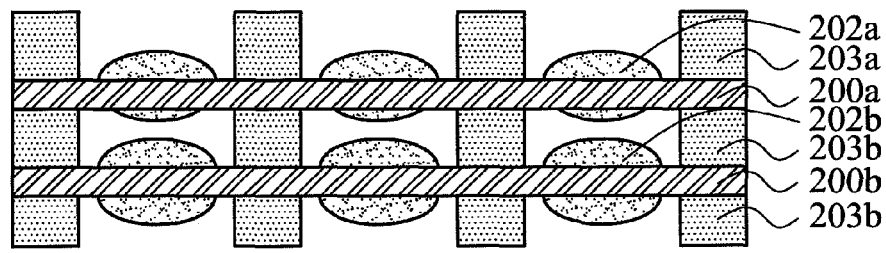
Figure 1C:
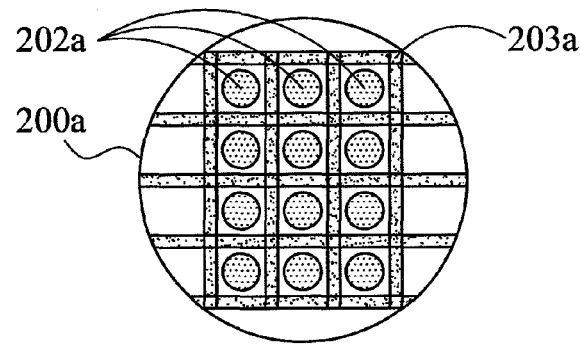

Alternatively, FIG. 1b is a cross section view showing another exemplary embodiment of lens sets, in which the lens sets are constituted by lens elements on two wafers. As shown in FIG. 1b, a second wafer 200a having second lens elements 202a thereon is bonded to the first spacer elements 203b on the first wafer 200b so that the first wafer 200b and the second wafer 200a are stacked together. A spacer element 203a is then formed on the second wafer 200a for isolating second lens elements 202a each other. The second wafer 200a may comprise a transparent material. The second spacer elements 203a may be arranged as an array on the upper surface of the second wafer 200a. The second lens elements 202a align to the first lens elements 202b. FIG. 1c is a top view showing the exemplary embodiment of lens sets constituted by two wafers and lens elements thereon. Alternatively, one more wafer with lens elements thereon may bond to the second wafer 200a or first wafer 200b. The following description will take one embodiment as shown in 1b and 1c, but is not limited to the disclosed embodiments.

Figure 2A:
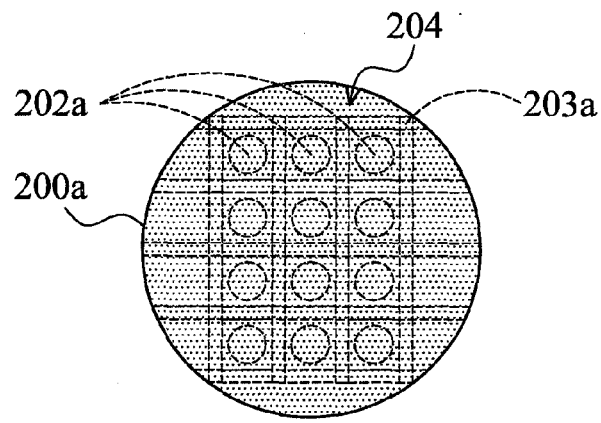
Figure 2B:
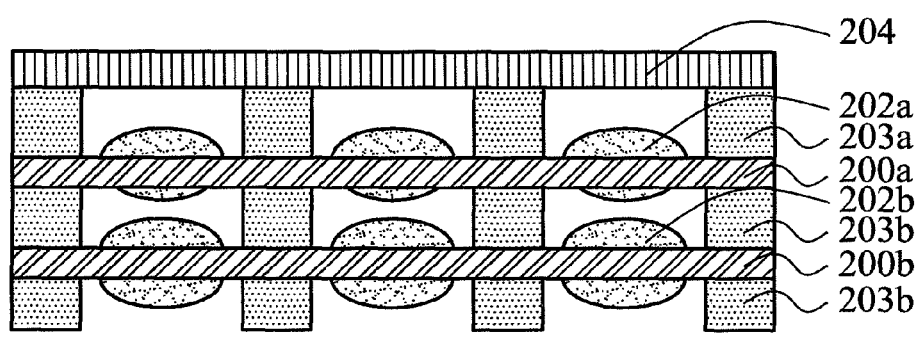

Next, referring to FIGS. 2a and 2b, a dry film layer 204 is laminated on the second spacer element 203a by a pressing process. In one embodiment, the dry film layer 204 covers an entire region of the wafer-level lens sets constituted by the first wafer 200b and the second wafer 200a.

Figure 3A:
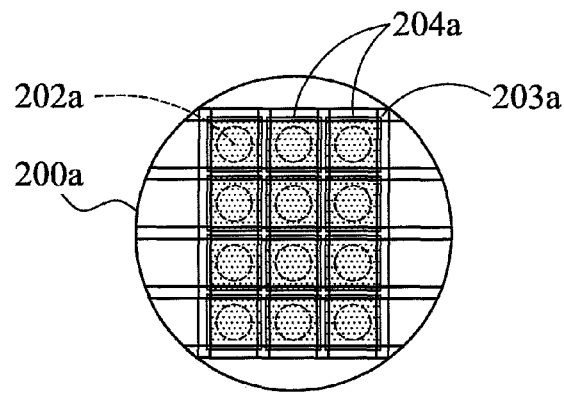
Figure 3B:
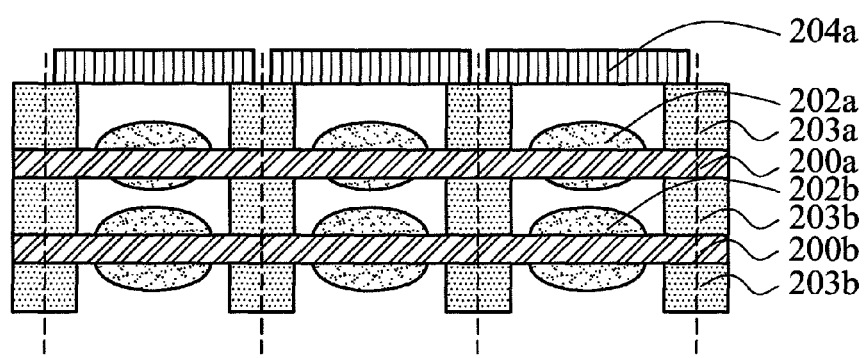

FIGS. 3a and 3b show a process step to form dry film patterns 204a respectively attaching to the lens sets. The dry film layer 204 may be formed of a photosensitive material, therefore the dry film layer 204 may serve as a photoresist layer. As shown in FIGS. 3a and 3b, a lithography process is performed to remove a portion of the dry film layer 204 thereby patterning the dry film layer 204 into dry film patterns 204a. In one embodiment, the lithography process may include alignment, exposing, and developing the dry film layer 204. Next, a curing process may be performed to fully cure the dry film patterns 204a below 75° C. In one embodiment, the dry film patterns 204a respectively cover each of the lens sets. The dry film patterns 204a have a protection function for the underlying lens elements 202a. In one embodiment, the dry film layer 204 is processed below 75° C. for the steps of lamination, exposure, development, and so forth. The dry film layer 204 is not flowable below 75° C., therefore the individual lens set can be covered with a solidified dry film pattern 204a without being contaminated by a fluid dry film materials or other particles and impurities.

Figure 4:
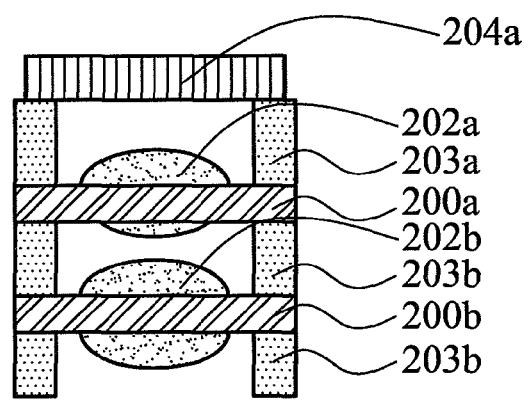

Next, the wafer-level lens sets covered with dry film patterns 204a are separated by a sawing process along first spacer element 203b and second spacer element 203a. For example, wafer-level lens sets are divided along the scribe line, dotted line as shown in FIG. 3b. In one embodiment, the first wafer 200b with lens elements 202b thereon and the second wafer 200a with lens elements 202b thereon are divided into individual lens sets. FIG. 4 illustrates one of the individual lens sets. The lens set as shown in FIG. 4 has first lens elements 202b on two sides of the first wafer 200b and second lens elements 202a on two sides of the second wafer 200a. Also, the dry film pattern 204a faces and overlies the second lens elements 202a of the lens set.

Figure 5:
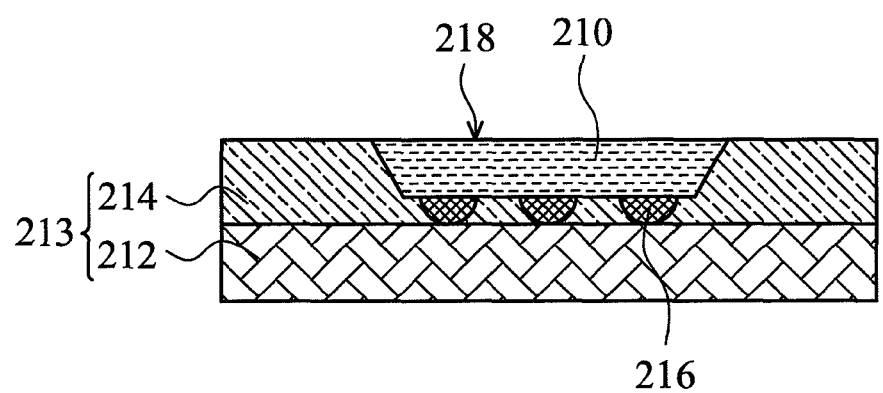

Next, referring to FIG. 5, a mounting process may be performed, by placing and pressing an image sensor device chip 210, having a plurality of solder balls 216 on a bottom surface of the image sensor device chip 210 on a carrier 213. In one embodiment, the carrier 213 may be a thermal tape comprising a flexible film 212 and a glue 214 thereon to fix the image sensor device chip 210. In one embodiment, the image sensor device chip 210 may comprise complementary metal-oxide-semiconductor (CMOS) devices or charge-coupled devices (CCDs).

Figure 6:
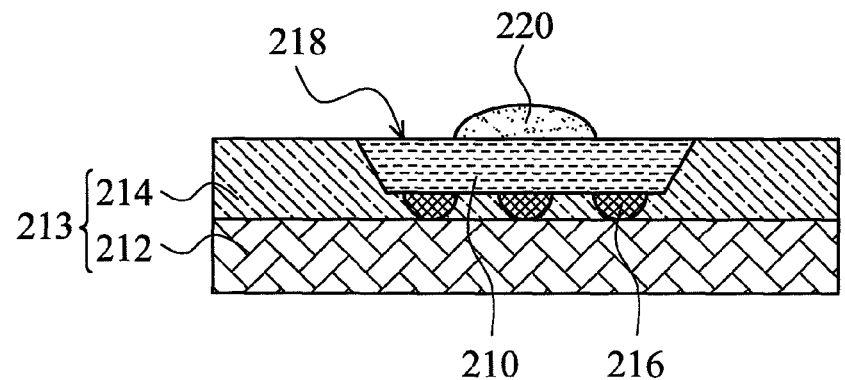

Next, referring to FIG. 6, a dispensing process is performed to apply an adhesive 220 to a top surface 218 of the image sensor device chip 210 for bonding of the lens set as shown in FIG. 4. In one embodiment, the adhesive 220 may comprise resin, epoxy adhesive polymer.

Figure 7:
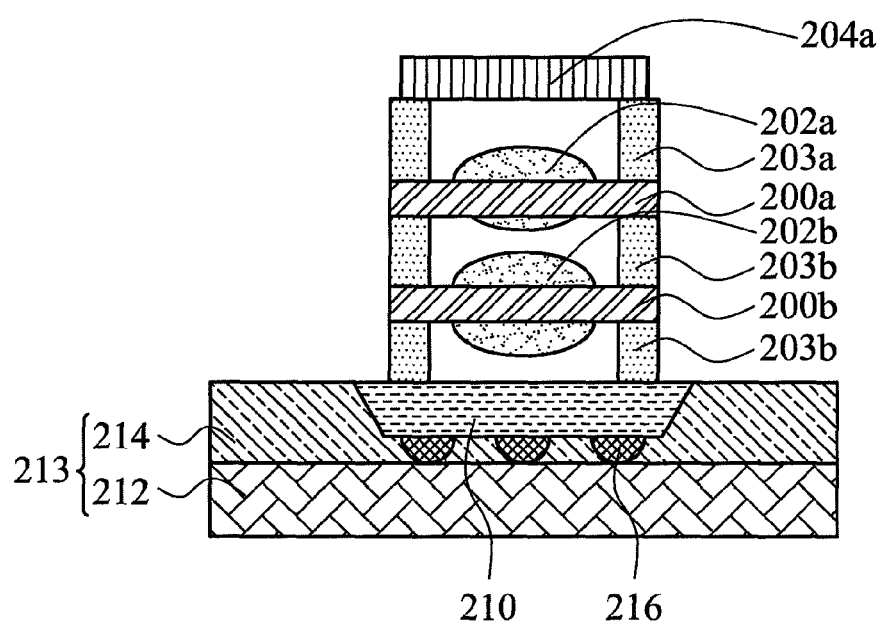

Next, referring to FIG. 7, the lens set may be bonded onto the top surface 218 of the image sensor device chip 210, by placing and pressing the lens set on the image sensor device chip 210, centrally.

Figure 8:
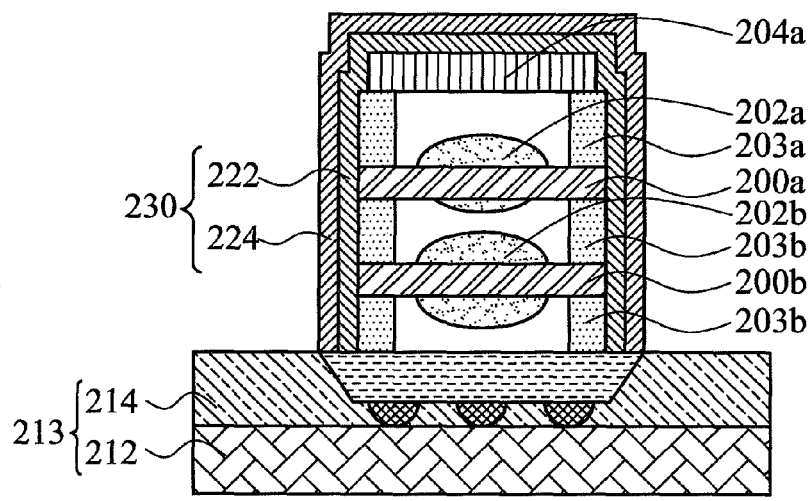

Next, referring to FIG. 8, a protective film 230 is formed covering the lens set. The formation of the protective film 230 may comprise performing a coating process, such as a spray coating process, to coat a metal material entirely over the lens set and the dry film pattern 204a to form a metal layer 222. In one embodiment, the metal layer 222 may comprise Al, Cu or the like (Ag, Iron coating). The metal layer 222 may serve as an electromagnetic interference (EMI) shield to provide an electromagnetic interference (EMI) shielding function for the image sensor device chip 210. Next, another coating process such as a spray coating process is performed to coat a first light shielding material covering the metal layer 222 to form a light shielding layer 224. In one embodiment, the light shielding layer 224 may comprise a black paint to prevent internal reflections. In one embodiment, the protective film 230, comprising the metal layer 222 and the light shielding layer 224, has a protection function for the lens set.

Figure 9:
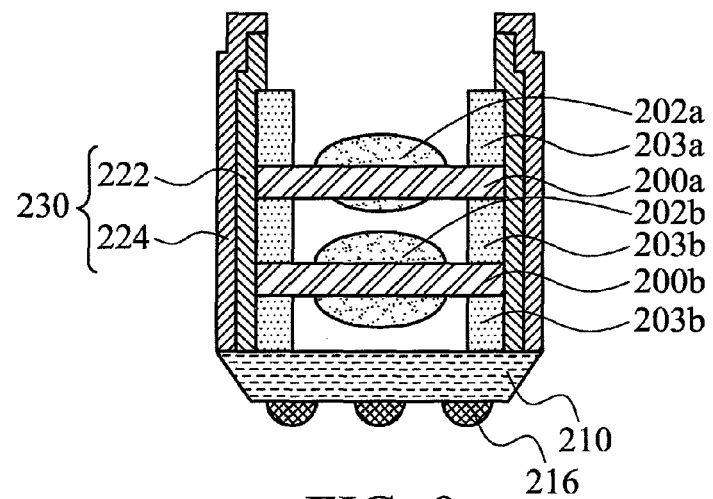

Next, referring to FIG. 9, a laser cutting process is performed to cut a portion of the metal layer 222, the light shielding layer 224 and the dry film pattern 204a. The remainder the dry film pattern 204a over the lens set is dipped in a solution containing an organic solvent such as acetone. Next, the dry film pattern 204a may be removed and stripped by oscillating in the solution containing the organic solvent. In this step, the metal layer 222, the light shielding layer 224 over the dry film pattern 204a may simultaneously be taken out. Moreover, Oscillation of the solution facilitates removal efficiency of the dry film pattern 204a, a portion of the metal layer 222 and the light shielding layer 224 over the lens element 202a. After dry film pattern 204a is removed by the solution containing the organic solvent, no residue will be left inside of lens set.

Alternatively, a cleaning process may be performed to remove residue of the dry film pattern 204a, the metal layer 222 and the light shielding layer 224 over the lens set.

As shown in FIG. 9, the metal layer 222 and the light shielding layer 224 shield the camera module, except for the solder balls 216 and the aperture of the lens set. Next, the carrier 213 as shown in FIG. 8 is torn off from the image sensor device chip 210. Therefore, the description of fabrication of one exemplary embodiment of a camera module of the invention is completed.

One exemplary embodiment of a method for fabricating a camera module is provided. The method for fabricating the camera module utilizes a dry film as a protection film to prevent an aperture of a lens set from being covered by coating materials such as an electromagnetic interference (EMI) shielding material or a light shielding material applied during subsequent processes. The dry film layer is formed on the lens set in by a wafer-level lithography process before dividing the wafer level lens sets into individual lens sets. Therefore, the process using the dry film layer in wafer level has high throughput. Because dry film layer is formed by the wafer level lithography process, dry film patterns can be located exactly on lens sets by an alignment step of the wafer level lithography process. Also, the dry film layer has good dimension control ability. Moreover, during the step of forming lens set, the dry film patterns for the lens sets may be easily removed without additional process steps.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a camera module, comprising:
   providing a plurality of lens sets;
   forming a dry film layer on the plurality of lens sets;
   patterning the dry film layer to form a plurality of dry film patterns respectively attaching to a plurality of lens sets;
   separating the plurality of lens sets;
   bonding a lens set separated from the plurality of lens sets to an image sensor device chip; and
   removing the dry film pattern on the lens set.

2. The method for fabricating a camera module as claimed in claim 1, further comprising:
   forming a protective film on the lens set.

3. The method for fabricating a camera module as claimed in claim 2, wherein forming the protective film comprises:
forming a metal layer on the dry film pattern; and
forming a light shielding layer on the metal layer.

4. The method for fabricating a camera module as claimed in claim 1, wherein removing the dry film pattern further comprises:
cutting the dry film pattern by a laser process;
dipping the dry film pattern by an organic solvent; and
oscillating the dry film pattern.

5. The method for fabricating a camera module as claimed in claim 4, wherein the organic solvent comprises acetone.

6. The method for fabricating a camera module as claimed in claim 1, further comprising cleaning the lens set after removing the dry film pattern.

7. The method for fabricating a camera module as claimed in claim 1, wherein providing the plurality of lens sets further comprises:
providing a first wafer having a plurality of first lens elements thereon; and
forming a first spacer element on the first wafer for isolating the first lens elements each other.

8. The method for fabricating a camera module as claimed in claim 7, wherein separating the plurality of lens sets further comprising dividing the first wafer along the first spacer element by a sawing process.

9. The method for fabricating a camera module as claimed in claim 7, wherein forming the dry film layer comprising laminating a photosensitive material layer on the first spacer element.

10. The method for fabricating a camera module as claimed in claim 7, further comprising:
bonding a second wafer to the first wafer, wherein the second wafer has a plurality of second lens elements aligning to the plurality of first lens elements and a second spacer element for isolating the second lens elements each other.

11. The method for fabricating a camera module as claimed in claim 10, wherein separating the plurality of lens sets further comprising dividing the first wafer and the second wafer along the first spacer element and the second spacer element by a sawing process.

12. The method for fabricating a camera module as claimed in claim 10, wherein forming the dry film layer comprising laminating a photosensitive material layer on the second spacer element.

13. The method for fabricating a camera module as claimed in claim 1, wherein patterning the dry film layer further comprises:
exposing the dry film layer;
developing the dry film layer to form the dry film patterns; and
baking the dry film patterns under a temperature below 75° C.

14. The method for fabricating a camera module as claimed in claim 1 further comprising:
applying an adhesive on the image sensor device chip to bond the lens set.

15. A method for fabricating a camera module, comprising:
providing a first wafer having a plurality of first lens elements thereon;
forming a first spacer element on the first wafer for isolating the first lens elements each other;
forming a dry film layer on the first spacer element;
patterning the dry film layer to form a plurality of dry film patterns respectively attaching to a plurality of lens sets;
separating the plurality of lens sets;
bonding a lens set separated from the plurality of lens sets to an image sensor device chip; and
removing the dry film pattern on the lens set.

16. A method for fabricating a camera module, comprising:
providing a first wafer having a plurality of first lens elements thereon;
forming a first spacer element on the first wafer for isolating the first lens elements each other;
bonding a second wafer having a plurality of second lens elements to the first spacer element, wherein the plurality of second lens elements aligns to the plurality of first lens elements;
forming a second spacer element on the second wafer for isolating the second lens elements each other;
forming a dry film layer on the second spacer element;
patterning the dry film layer to form a plurality of dry film patterns respectively attaching to a plurality of lens sets;
separating the plurality of lens sets;
bonding a lens set separated from the plurality of lens sets to an image sensor device chip; and
removing the dry film pattern on the lens set.

* * * * *